United States Patent
Kuo

Patent Number: 6,043,144
Date of Patent: Mar. 28, 2000

[54] BONDING-PAD STRUCTURE FOR INTEGRATED CIRCUIT AND METHOD OF FABRICATING THE SAME

[75] Inventor: Chien-Li Kuo, Hsinchu Hsien, Taiwan

[73] Assignee: United Microelectronics Corp., Taipei, Taiwan

[21] Appl. No.: 09/152,920

[22] Filed: Sep. 14, 1998

[30] Foreign Application Priority Data

May 25, 1998 [TW] Taiwan ................................. 87108046

[51] Int. Cl.$^7$ ................................................... H02L 21/44
[52] U.S. Cl. ........................... 438/612; 438/597; 438/611; 438/613
[58] Field of Search .................... 438/612, 597, 438/611, 613

[56] References Cited

U.S. PATENT DOCUMENTS 5,801,094  9/1998  Yew et al. .
5,851,910  12/1998  Hsu et al. .

Primary Examiner—Kevin M. Picardat
Assistant Examiner—D. M. Collins
Attorney, Agent, or Firm—Thomas, Kayden, Horstemeyer & Risley

[57] ABSTRACT

A bonding-pad structure for integrated circuit is provided. The bonding-pad structure is designed for use in an IC chip constructed on a semiconductor substrate formed with a plurality of circuit components for the purpose of electrical connection to these circuit components. The bonding-pad structure comprises: a first metal-interconnect structure formed over the substrate for electrically interconnecting the various circuit components in the substrate; and a second metal-interconnect structure formed over the substrate within the first metal-interconnect structure, which has an exposed posed surface at a selected location on the bonding side of the IC chip to serve as a bonding pad. The second metal-interconnect structure further includes: a plurality of levels of metallization layers; and a plurality of insulating layers, each being used to isolate each pair of adjoining levels of metallization layers, and each being formed with a contact window therein to electrically connect the two adjoining levels of metallization layers. Moreover each level of metallization layer is smaller in area than the next higher level of metallization layer. This bonding-pad structure can be formed not only within the peripheral area of the IC chip, but also within the internal-circuit area of the same, so that the overall size of the IC chip can be made small even though the IC chip includes a very large number of bonding pads.

10 Claims, 3 Drawing Sheets

BONDING-PAD STRUCTURE FOR INTEGRATED CIRCUIT AND METHOD OF FABRICATING THE SAME

CROSS-REFERENCE TO RELATED APPLICATION

This application claims the priority benefit of Taiwan application serial no. 87108046, filed May 25, 1998, the full disclosure of which is incorporated herein by reference.

BACKGROUND OF THIS INVENTION

1. Field of the Invention

This invention relates to semiconductor fabrication technologies, and more particularly, to a bonding-pad structure for integrated circuit and a method of fabricating the same, which allows the bonding pads on the IC chip to be arranged at any locations on the surface of the IC chip.

2. Description of Related Art

The manufacturing process for integrated circuits (IC) includes three stages: wafer preparation, integrated circuit fabrication, and packaging. A wafer is a round piece of a semiconductor material which is subdivided into a number of dies on each of which one IC unit is fabricated. In the case of fabricating a VLSI (very large-scale integration) IC chip with a line width of 0.25 $\mu$m (micrometer), for example, it requires a wafer of a diameter of 8 in (200 mm), which is subdivided into a total of more than 200 dies, each being about 2 $cm^2$ in size. After circuit components are formed into the wafer, each of these dies is then cut apart from the fabricated wafer (Note that in semiconductor terminology, a die cut apart from the fabricated wafer is then referred to as a chip). Each chip is then packaged in a hermetically sealed compound to form a complete IC package. The fabrication and packaging of the IC chip is typically a very complex process and requires state-of-the-art technologies to achieve. The basic steps of a typical manufacturing process for an IC package are briefly depicted in the following with reference to FIGS. 1A–1D.

Referring first to FIG. 1A, a fabricated wafer 10 includes a number of dies 12, each being a single IC unit that is then cut apart from the wafer 10 (each cut-apart die is then referred to as a chip). Referring next to FIG. 1B, in the subsequent step, each chip 12 is mounted on a leadframe 14 having a plurality of pins 16. Referring further to FIG. 1C, a wire-bonding process is then performed so as to connect a plurality of conductive wires 18 between the bonding pads (not shown) on the chip 12 and the pins 16 on the leadframe 14. Referring next to FIG. 1D, a resin compound 19 is then formed to hermetically seal the chip 12 therein. This completes the packaging of the chip 12. In the foregoing manufacturing process for the IC package, various methods can be used for the packaging of the IC chip, such as TAB, PGA, and BGA, to name a few.

An IC chip is customarily formed with a plurality of bonding pads on the surface thereof, which can be connected via wires to the pins on the leadframe through a wire bonding process. This allows the internal circuit of the IC chip to be later electrically connected to external circuitry via the pins. A conventional bonding-pad structure is illustratively depicted in the following with reference to FIGS. 2A–2B.

As shown in FIG. 2A, an IC chip 20 is typically subdivided into an internal-circuit area 22 where the various circuit components (not shown) of the IC chip are formed, and a peripheral area 24 where a plurality of bonding pads 26 are formed. These bonding pads 26 are structured in the same manner. The structure of each of the bonding pads 26 is depicted in the following with reference to FIG. 2B.

FIG. 2B shows a schematic cross-sectional view of the part of the IC chip 20 of FIG. 2A that is enclosed by a dashed box indicated by the reference numeral 25, i.e., the bonding-pad structure of one of the bonding pads 26. As shown, the bonding-pad structure comprises an insulating layer 27, such as an oxide layer; and a multi-layer metallization structure formed over the insulating layer 27, including a first metallization layer 29a, a second metallization layer 29b, a third metallization layer 29c, and a fourth metallization layer 29d. Further, a multi-layer insulation structure is formed around the multi-layer metallization structure for insulation purpose, which includes a first insulating layer 28a, a second insulating layer 28b, and a third insulating layer 28c.

One drawback to the foregoing conventional bonding-pad structure, however, is that it is a low-integration structure that may be unsuited to more advanced technologies with higher integration. Moreover, since the conventional bonding-pad structure can be formed only in the peripheral area 24 of the IC chip 20, the peripheral area 24 will be very large when a large number of bonding pads are formed. In this case, the overall size of the IC chip 20 will be considerably large.

SUMMARY OF THE INVENTION

It is therefore an objective of the present invention to provide a bonding-pad structure for integrated circuit, which can be formed not only within the peripheral area of the IC chip, but also within the internal-circuit area of the same, so that the overall size of the IC chip can be made small even though the IC chip includes a very large number of bonding pads.

It is another objective of the present invention to provide a bonding-pad structure for integrated circuit, which can be formed within the internal-circuit area as well as within the peripheral area of the IC chip, thus allowing the bonding wires to be reduced in length for cost-effective manufacture of the IC package.

In accordance with the foregoing and other objectives of the present invention, a new bonding-pad structure for integrated circuit is provided. The bonding-pad structure of the invention is provided for use in an IC chip constructed on a semiconductor substrate formed with a plurality of circuit components, which comprises:

a first metal-interconnect structure formed over the substrate for electrical inter-connection of the internal circuit of the IC chip formed in the substrate; and a second metal-interconnect structure formed over the substrate within the first metal-interconnect structure, which has an exposed surface at a selected location on the IC chip to serve as a bonding pad.

In the foregoing bonding-pad structure, the second metal-interconnect structure further includes:

at least one metallization layer formed over the substrate within the first metal-interconnect structure;

at least one insulating layer covering the metallization layer;

at least one contact window formed in the insulating layer, which is electrically connected to the metallization layer; and at least one top metallization layer formed over the insulating layer, which is electrically connected via the contact window to the metallization layer, serving as the bonding pad.

The method of the invention includes the following steps of:

(1) forming a first metal-interconnect structure over the substrate for electrical interconnection of the internal circuit of the IC chip formed in the substrate;

(2) forming a second metal-interconnect structure over the substrate within the first metal-interconnect structure through the substeps of:

(2-1) forming a metallization layer over the substrate within the first metal-interconnect structure;

(2-2) forming an insulating layer covering the metallization layer;

(2-3) forming a contact window in the insulating layer, with the contact window being electrically connected to the metallization layer; and (2-4) forming a top metallization layer over the insulating layer, with the top metallization layer being electrically connected via the contact window to the underlying metallization layer and serving as the bonding pad.

In embodiment, the second metal-interconnect structure includes a plurality of levels of metallization layers; and a plurality of insulating layers, each being used to isolate each pair of adjoining levels of metallization layers, and each being formed with a contact window therein to electrically connect the two adjoining levels of metallization layers. Moreover, each level of metallization layer is smaller in area than the next higher level of metallization layer. This bonding-pad structure can be formed not only within the peripheral area of the IC chip, but also within the internal-circuit area of the same, so that the overall size of the IC chip can be made small even though the IC chip includes a very large number of bonding pads.

BRIEF DESCRIPTION OF DRAWINGS

The invention can be more fully understood by reading the following detailed description of the preferred embodiments, with reference made to the accompanying drawings. wherein.

DETAILED DESCRIPTION OF PREFERRED EMBODIMENTS

The invention provides a bonding-pad structure for integrated circuit and a method of fabricating the same, which is characterized in the forming of a metal-interconnect structure at a selected location in the internal-circuit area of the IC chip to serve as a bonding pad for the IC chip. The metal-interconnect structure can be a multi-level structure formed through a damascene process or a conventional metallization process. By the advanced damascene process, each level of metallization layer is formed by first forming an insulating layer over the substrate; then forming a trench structure in the insulating layer at a predefined location where the next higher level of metallization layer is to be formed; and then forming a contact hole beneath the trench structure; and finally filling up both the trench structure and the contact hole with a metal to electrically connect these two levels of metallization layers. The number of levels of metallization layers in the metal-interconnect structure is dependent on actual requirements. In accordance with the invention, any level of metallization layer is smaller in size (area) than the next higher level of metallization layer. The exposed surface of the topmost level of metallization layer then serves as a bonding pad for the IC chip. The invention allows the bonding pad to be arranged at any desired location on the surface of the IC chip including within the internal-circuit area such that the IC chip can be made even smaller with reduced length in the bond wiring.

The bonding-pad structure of the invention is particularly suitable for use in conjunction with the BGA (ball grid array) packaging technology. By the BGA method, a plurality of tin balls are provided to serve as electrical connectors, which can be arranged at any locations over the IC chip, including both the internal-circuit area and the peripheral area. The BGA packaging method has the benefits of low susceptibility to lead damage that can minimize the coplanar requirement and allowing a large tolerance in the disposition of the various circuit components in the IC chip.

A preferred embodiment of the bonding-pad structure of the invention is disclosed in the following with reference to FIGS. 3A–3B.

Figure 1A:
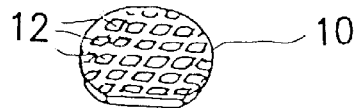
FIGS. 1A–1D are schematic diagrams used to depict the basic steps of a typical manufacturing process for an IC package.
Figure 1B:
Figure 1B:
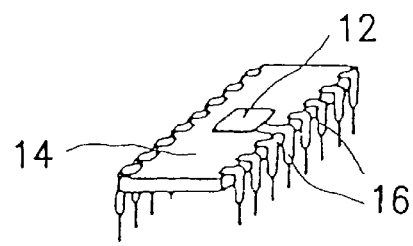
Figure 1C:
Figure 1C:
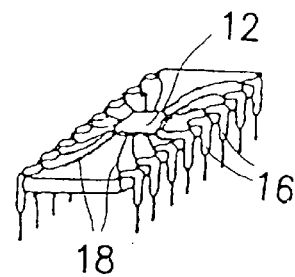
Figure 1D:
Figure 1D:
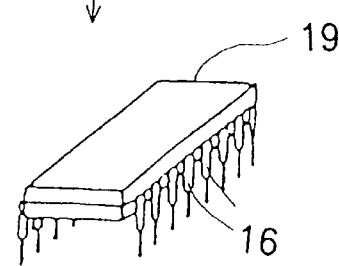
Figure 2A:
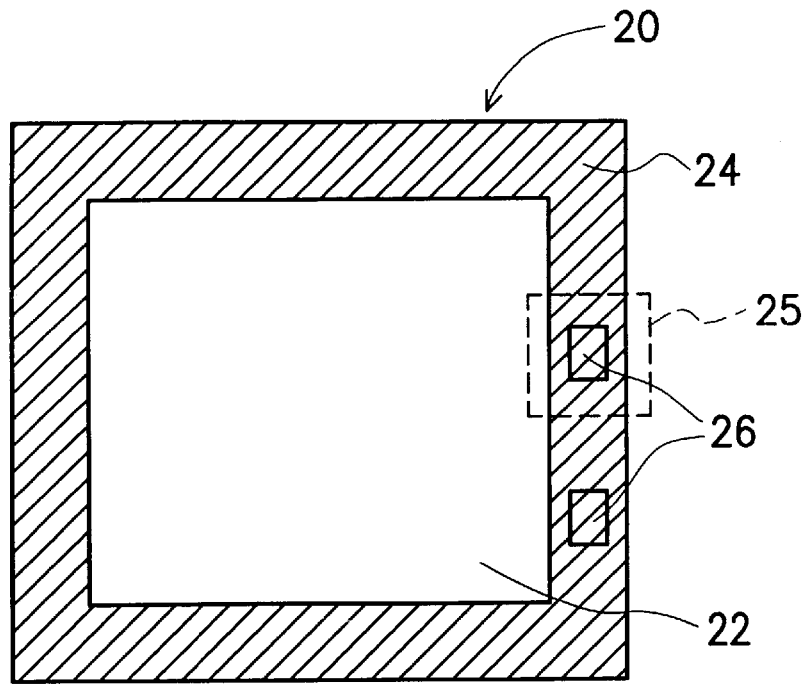
FIG. 2A is a schematic top view of an IC chip formed with a plurality of bonding pads that are formed by a conventional method.
Figure 2B:
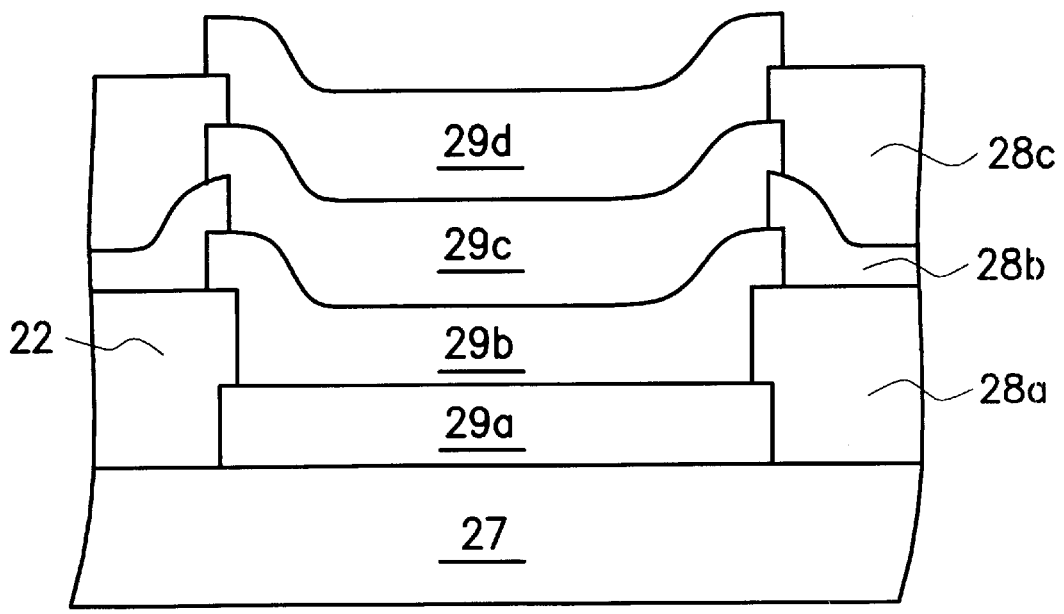
FIG. 2B is a schematic cross-sectional view of a conventional structure for each bonding pad in the IC chip of FIG. 2A.
Figure 3A:
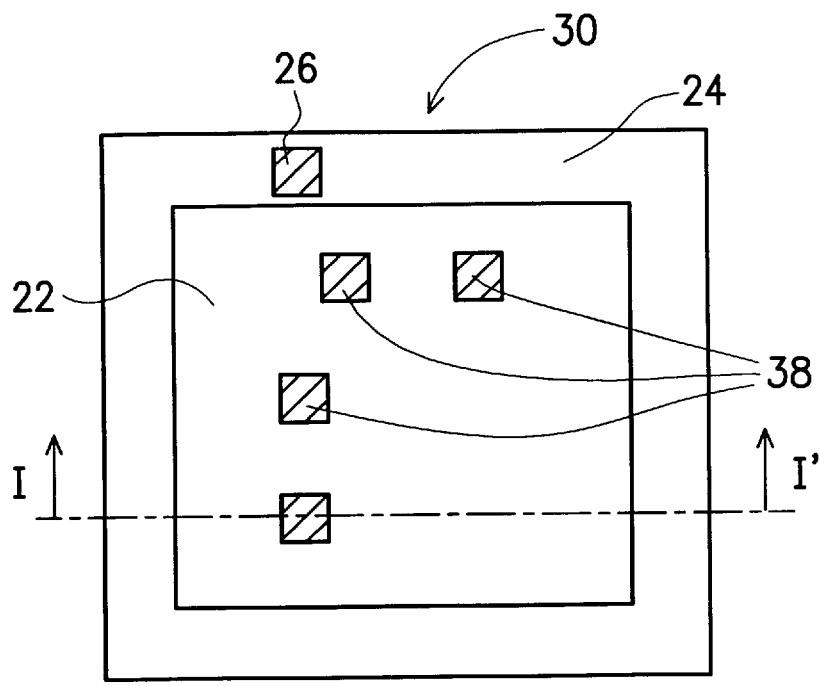
FIG. 3A is a schematic top view of an IC chip that is formed with a plurality of bonding pads which are structured and formed by the method of the invention.

FIG. 3A is a schematic top view of an IC chip 30 that is formed with a plurality of bonding pads 38, which are all structured in accordance with the invention. It is a characteristic feature of the invention that these bonding pads 38 can be arranged at any locations on the IC chip, including the internal-circuit area as well as the peripheral area of the IC chip.

Figure 3B:
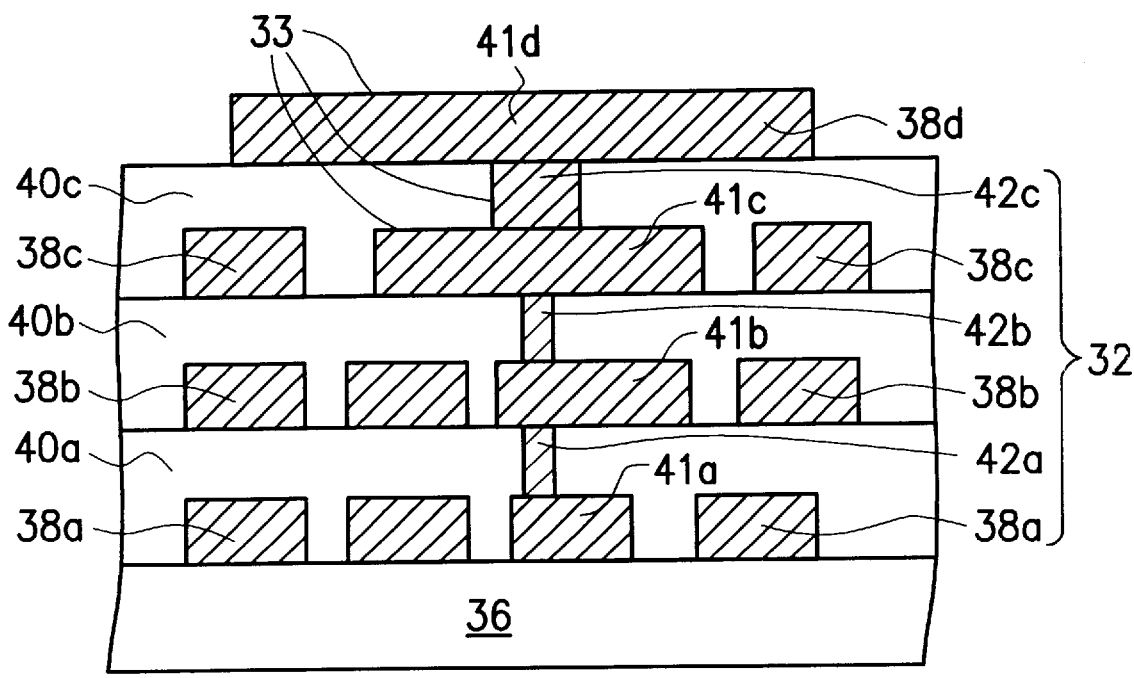
FIG. 3B is a cross-sectional view of the structure of one bonding pad shown in FIG. 3A cutting through the line A–A'.

FIG. 3B is a cross-sectional view showing the structure of one of the bonding pads 38 shown in FIG. 3A cutting through the line I–I'. As shown, the bonding-pad structure is constructed on a semiconductor substrate 36 (Note that this substrate 36 is also used to form the various circuit components of the internal circuit of the IC chip 30, but since the fabrication and structure of these circuit components are beyond the scope and spirit of the invention, they are eliminated and not shown in the drawings).

A first metal-interconnect structure is then formed over the substrate 36 for electrically interconnecting the various circuit components (not shown) in the substrate 36 In addition, the second metal-interconnect structure 32 is formed within the first metal-interconnect structure and can be a multi-layer metal-interconnect structure, as shown in FIG. 3B. Concurrently, a second metal-interconnect structure 32 is formed together with the first metal-interconnect structure over the substrate 36. This second metal-interconnect structure 32 is formed by the following steps.

First, a first-level metallization layer 38a is formed over the substrate 36. Then, a first-level insulating layer 40a is formed to cover the first-level metallization layer 38a. Next, a first-level contact window 42a is formed in the first-level insulating layer 40a at a predefined location, which is electrically connected to the first-level metallization layer 38a.

Subsequently a second-level metallization layer 38b is formed over the firstlevel insulating layer 40a at the location where the first-level contact window 42a is formed, allowing the second-level metallization layer 38b to be electrically connected via the first-level contact window 42a to the underlying first-level metallization layer 38a. A second-level insulating layer 40b is then formed to cover the second-level metallization layer 38b. Further, a second-level contact window 42b is formed in the second-level insulating layer 40b at a predefined location, which is electrically connected to the second-level metallization layer 38b.

Next, a third-level metallization layer 38c is formed over the second-level insulating layer 40b at the location where the second-level contact window 42b is formed, allowing the third-level metallization layer 38c to be electrically connected via the second-level contact window 42b to the underlying second-level metallization layer 38b. A third-level insulating layer 40c is then formed to cover the third-level metallization layer 38c. Further, a third-level contact window 42c is formed in the third-level insulating layer 40c at a predefined location which is electrically connected to the third-level metallization layer 38c.

Finally, a top metallization layer 38d is formed over the third-level insulating layer 40c at the location where the third-level contact window 42c is formed, allowing the top metallization layer 38d to be electrically connected via the third-level contact window 42c to the third-level metallization layer 38c. The top metallization layer 38d serves as a bonding pad that can be wired to the corresponding pin for connection to external circuitry. The first-level metallization layer 38a, the second-level metallization layer 38b the third-level metallization layer 38c, the top metallization layer 38d, and the interconnecting contact windows 42a, 42b, 42c in combination constitute the above-mentioned second metal-interconnect structure 32.

In accordance with the invention, the second metal-interconnect structure 32 can be formed together with the first metal-interconnect structure through a damascene process, with the second metal-interconnect structure 32 being formed within the first metal-interconnect structure.

Further, each level of metallization layer is smaller in size (area) than the next higher level of metallization layer. In the case of FIG. 3B, for example, the first-level metallization layer 38a is smaller in size than the second-level metallization layer 38b; the second-level metallization layer 38b is smaller in size than the third-level metallization layer 38c; and the third-level metallization layer 38c is smaller in size than the top metallization layer 38d. The top metallization layer 38d, as illustrated in FIG. 3A, can be formed with a desired size and arranged at any location in the top surface of the IC chip 30.

In conclusion, the invention provides a bonding-pad structure and a method of fabricating the same, which has the following advantages over the prior art.

(1) First, the invention provides a bonding-pad structure which is compatible with BGA technology or the equivalent to form a high-integration IC package.

(2) Second, the invention provides a bonding-pad structure which can be formed not just within the peripheral area of the IC chip, but also within the internal-circuit area of the same (i.e., at any locations in the IC chip), allowing the IC chip to be reduced in layout area and the bond-wiring to be reduced in length.

(3) Third, the invention provides a bonding-pad structure which can be formed with an increased level of integration for metallization layers.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a bonding-pad structure for an IC chip constructed on a semiconductor substrate for electrical connection to an internal circuit of the IC chip, comprising the steps of:

forming a first metal-interconnect structure over the substrate for electrically interconnecting to the internal circuit of the IC chip;

forming a second metal-interconnect structure over the substrate within the first metal-interconnect structure, further comprising the steps of:

forming a metallization layer over the substrate within the first metal-interconnect structure;

forming an insulating layer covering the metallization layer;

forming a contact window in the insulating layer, with the contact window being electrically connected to the metallization layer; and forming a top metallization layer over the insulating layer, with the top metallization layer being electrically connected via the contact window to the underlying metallization layer and serving as the bonding pad.

2. The method of claim 1, wherein the first metal-interconnect structure is formed through a damascene process.

3. The method of claim 1, wherein the second metal-interconnect structure is formed through a damascene process.

4. The method of claim 1, wherein the second metal-interconnect structure is formed together with the first metal-interconnect structure through a damascene process.

5. The method of claim 1, wherein the second metal-interconnect structure includes:

a plurality of levels of metallization layers; and a plurality of insulating layers, wherein each of the insulating layers is used to isolate each pair of adjoining levels of the metallization layers, and a contact window is formed within each of the insulating layers to electrically connect the two adjoining levels of the metallization layers.

6. The method of claim 5, wherein each level of the metallization layer is smaller in area than the next higher level of the metallization layer.

7. The method of claim 1, wherein the bonding pad is located within an internal-circuit area of the IC chip.

8. The method of claim 1, further comprising the step of:

performing a Ball Grid Array (BGA) packaging process to the bonding-pad on the IC chip so as to pack the IC chip in an IC package.

9. A method for fabricating a bonding-pad structure for an IC chip constructed on a semiconductor substrate for electrical connection to an internal circuit of the IC chip, comprising the steps of:

forming a first metal-interconnect structure over the substrate for electrically interconnecting to the internal circuit of the IC chip forming a second metal-interconnect structure within the first metal-interconnect over the substrate, wherein the second metal-interconnect structure comprises a plurality of interconnection structures; and forming a top metallization layer over the second metal-interconnect structure, wherein the top metallization layer is electrically connected to the underlying multi-layer metal-interconnect structure and serves as the bonding pad.

10. The method of claim 10, wherein the, wherein the step of forming the second metal-interconnect structure further comprising the steps for each of the interconnection structures:

forming a metallization layer over the substrate within the first metal-interconnect structure;

forming an insulating layer covering the metallization layer; and forming a contact window within the insulating layer for electrically connecting to the metallization layer.

* * * * *